United States Patent [19]

Beakes et al.

[11] Patent Number: 5,748,012

[45] Date of Patent: May 5, 1998

[54] METHODOLOGY TO TEST PULSED LOGIC CIRCUITS IN PSEUDO-STATIC MODE

[75] Inventors: Michael Patrick Beakes, Yorktown Heights, N.Y.; Barbara Alane Chappell; Terry Ivan Chappell, both of Portland, Oreg.; Bruce Martin Fleischer, Mt. Kisco; Rudolf Adriaan Haring, Cortlandt Manor, both of N.Y.; Talal Kamel Jaber, Autin; Edward Seewann, Austin, both of Tex.

[73] Assignee: International Business Machines Corporation, Armonk, N.Y.

[21] Appl. No.: 583,300

[22] Filed: Jan. 5, 1996

Related U.S. Application Data

[60] Provisional application No. 60/084,242 Dec. 6, 1995.

[51] Int. Cl.[6] .................................................. H03K 19/003

[52] U.S. Cl. ..................... 326/93; 326/16; 326/21; 326/40; 371/22.5

[58] Field of Search ........................... 326/17, 21, 16, 326/40, 41, 93, 98; 371/22.2, 22.5, 22.6

[56] References Cited

U.S. PATENT DOCUMENTS

| 5,543,731 | 8/1996 | Sigal et al. | 326/40 |
| 5,543,735 | 8/1996 | Lo | 326/93 |
| 5,557,620 | 9/1996 | Miller, Jr. et al. | 371/22.5 |
| 5,565,798 | 10/1996 | Durham et al. | 326/17 X |

Primary Examiner—David R. Hudspeth
Attorney, Agent, or Firm—Robert P. Tassinari, Jr.

[57] ABSTRACT

A pulsed logic circuit test methodology and circuitry therefor are disclosed. The methodology and circuitry allow the inhibiting of reset pulses, the ability to force resets and the ability to test the circuit in a pseudo-static mode of operation.

15 Claims, 2 Drawing Sheets

METHODOLOGY TO TEST PULSED LOGIC CIRCUITS IN PSEUDO-STATIC MODE

This application claims the benefit of U.S. Provisional Application No. 60/084,242 filed on Dec. 6, 1995.

FIELD OF THE INVENTION

The present invention describes a method for the circuit level testing of pulsed logic in pseudo-static mode. The method features the ability to inhibit the reset of pulses, to force resets, and to convert the circuits to a pseudo-static mode of operation.

BACKGROUND OF THE INVENTION

In pulsed logic, such as Self-Resetting CMOS (SRCMOS) logic, data (logical 0's or 1's) are represented by pulses, or the absence of pulses, on a given net, rather than as voltage levels as in other logic families.

While having performance advantages, pulsed logic poses some problems in terms of circuit level testability.

First, given that in functional mode the data are pulses of short duration, after which the net returns to stand-by mode, some devices cannot be stressed for a reasonable length of time under burn-in conditions, or to measure leakage, unless the pulses are disabled and the nets can be forced either to stand-by or to active mode.

Second, on a mistimed chip, pulses arriving at the inputs of an AND-type circuit may fail to overlap sufficiently in time to switch the circuit. For diagnostic purposes, such timing faults must be distinguished from actual logical or "stuck-at" faults.

Third, if functional operation of pulsed logic would be required under burn-in conditions, adequate protection for noise immunity and against increased device leakage under burn-in conditions needs to be engineered into the circuits. This shrinks the design space, and will most likely compromise performance under normal functional conditions.

SUMMARY OF THE INVENTION

One aspect of the present invention is a dynamic circuit, comprising: a logic tree having one or more data inputs and a data evaluation node; a reset circuit connected to the evaluation node, and responsive to one or more reset signals; a reset inhibiting circuit coupled to the reset circuit, and responsive to a reset inhibiting signal; a static evaluate circuit coupled to the evaluation node of the logic tree, and responsive to a mode select signal.

DETAILED DESCRIPTION OF THE PREFERRED EMBODIMENTS

This invention is the test modes and test signals that we have defined to overcome the problems described above, to wit:

1. Global signals have been defined to force circuits to their reset states or to inhibit resets, thereby keeping circuits in their evaluated states. Details are given below.

2. To isolate timing faults, a so called "Static_Evaluate mode" has been defined, in which all circuits behave as if they are static, instead of pulsed. The circuit features needed to comply with this mode are described in detail below.

3. Circuits can then be tested under burn-in conditions in Static_Evaluate mode, rather than in high speed functional mode. Since in Static_Evaluate mode all signals behave as static, so that glitches and noise eventually die out, noise margin is of no concern, and circuits do not need to be specially engineered for burn-in conditions.

FIG. 1a shows a generic dynamic circuit, comprising a generic nFET pull-down tree 10 (See N. Weste and K. Eshraghian, "Principles of CMOS VLSI Design", pp. 168–169, Addison-Wesley, 1988, incorporated herein by reference) performing a desired logical function, an output inverter IO, and a reset or pre-charge device QR. A standby device QS is provided to hold evaluation node A in its high standby state (and, therefore, the output low) when neither QR is activated, nor the nFET tree 10 pulls down. Gates I21, I22 and I23 provide, schematically, the last stage of the reset/pre-charge circuitry. Notice that I21, I22 and I23 may be shared among many individual circuits that share the same node R.

In normal functional operation, $\overline{\text{Reset}}$ and $\overline{\text{Evaluate}}$ are both high. To reset evaluation node A to its standby state, node R_trig would be driven high, which results in QR being switched on.

NAND gates I21 and I22 provide for the ability to force QR on independently of R_trig, (Reset state by setting $\overline{\text{Evaluate}}$=high, and $\overline{\text{Reset}}$=low; Evaluate state and Reset inhibited by setting $\overline{\text{Evaluate}}$=low and $\overline{\text{Reset}}$=high.

The truth table in Table 1 summarizes the states of $\overline{\text{Reset}}$ and $\overline{\text{Evaluate}}$ and their corresponding operational modes:

TABLE 1

|  | $\overline{\text{Reset}}$ | $\overline{\text{Evaluate}}$ |
|---|---|---|
| Normal Functional Mode | High | High |
| Evaluate Mode | High | Low |
| Reset Mode | Low | High |
| Not Allowed | Low | Low |

Thus, as can be seen, the condition of $\overline{\text{Reset}}$ and $\overline{\text{Evaluate}}$ control the various operational modes of the system.

Figure 2A:
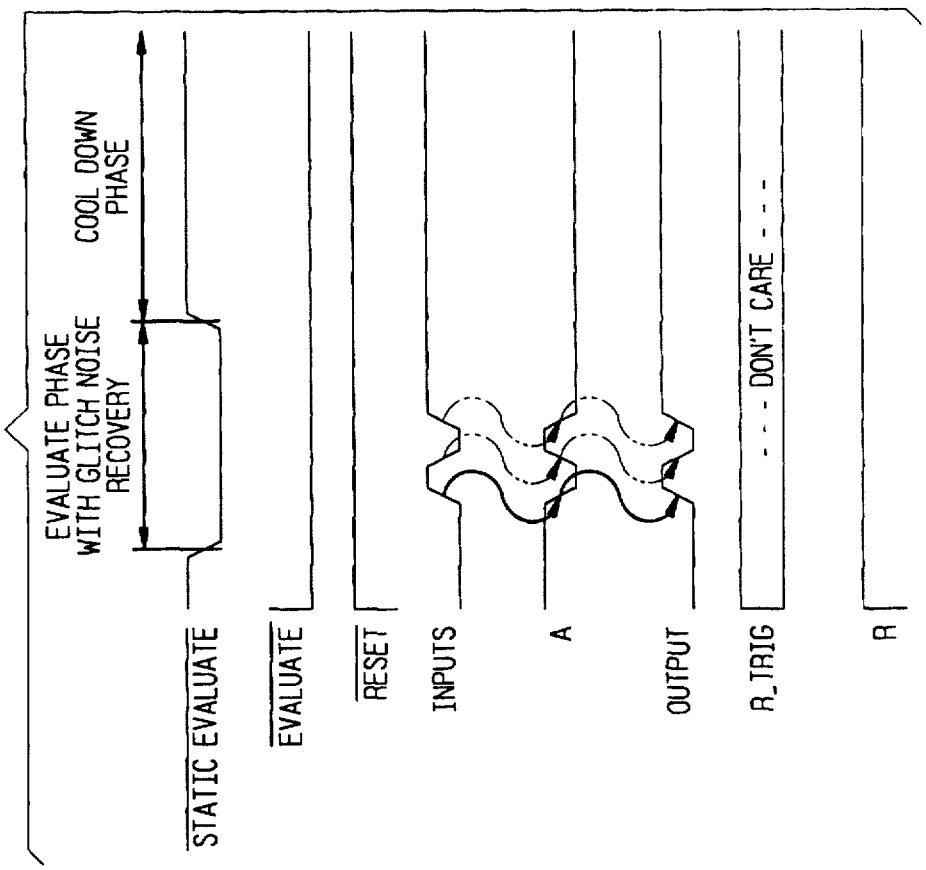
FIG. 2a is a timing diagram of the functional mode operation of the circuit of FIG. 1.

In normal functional operation, $\overline{\text{Reset}}$ (the locally inverted and buffered form of a global signal Reset) and $\overline{\text{Evaluate}}$ (the locally inverted and buffered form of a global signal Evaluate) are both high. FIG. 2a shows the waveforms in normal functional operation, following the occurrence of an input pulse at one of the inputs. If the inputs are such that the nFET logic tree evaluates, evaluation node A is discharged, giving rise to the OUTPUT going high. Subsequently, evaluation node A will have to be reset to its standby state. This is effected by signal R_trig (reset trigger) which can originate from a variety of sources (e.g., a system clock, one of the inputs, the output node or a node downstream).

Figure 1:
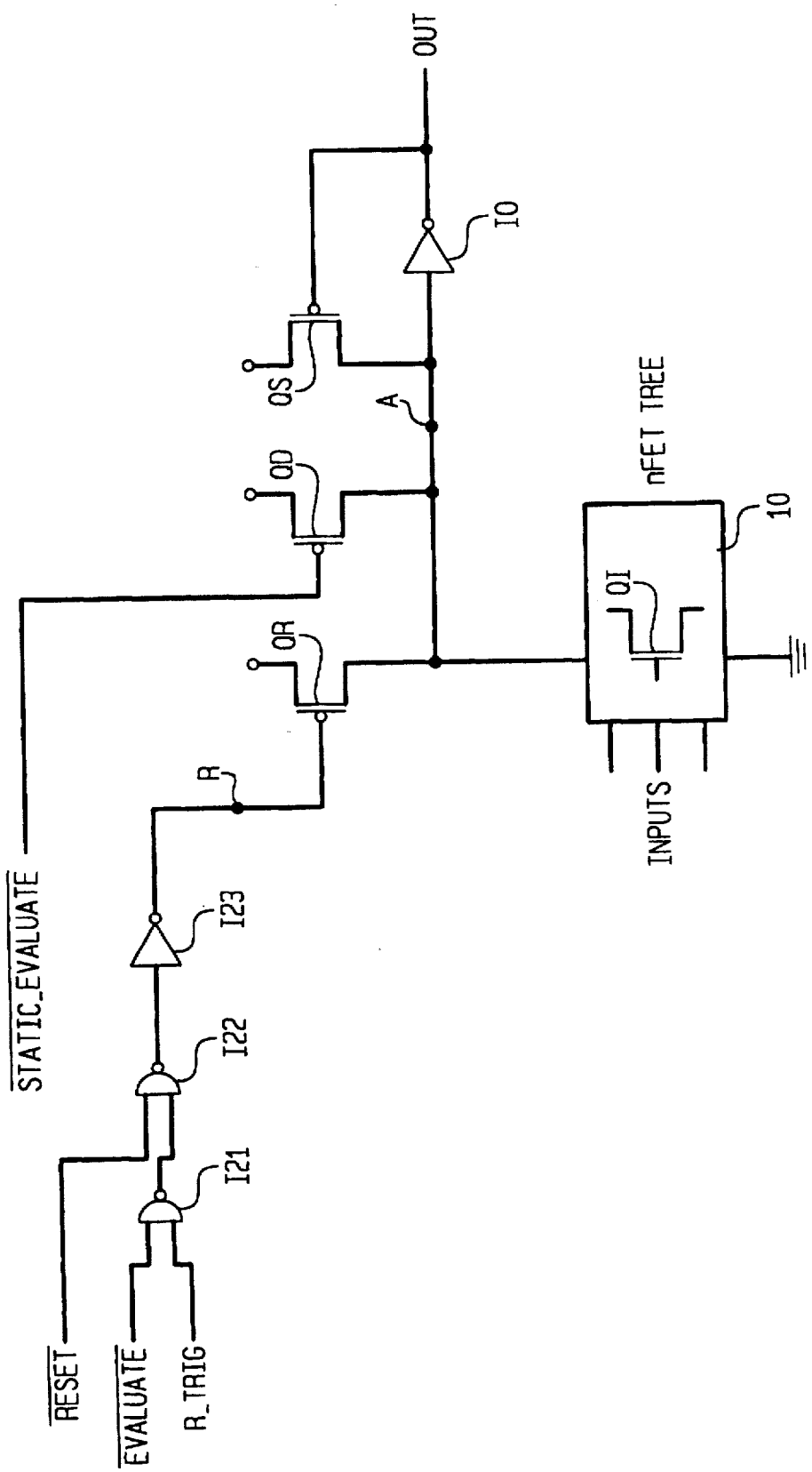
FIG. 1 is a schematic depiction of a dynamic circuit.

As a special case, if the reset trigger input R_trig is actually taken from the OUTPUT of the circuit of FIG. 1, the circuit is an implementation of the SRCMOS logic family. If $\overline{\text{Evaluate}}$ is high (Evaluate is low), a high level at OUT will trigger a low at the output of NAND gate I21, causing a high out of NAND I22, and a low out of inverter I23, turning Q3 on and raising evaluation node A high and producing a low at node OUT (See FIG. 2A for the case where OUTPUT=R_trig).

For further details of normal functional operation mode of SRCMOS circuits, see copending and commonly assigned U.S. application Ser. No. 08/463,146, Attorney Docket No. YO993-114 and incorporated herein by reference. See also T. I. Chappell et al "A 2-ns Cycle, 3.8ns Access 512-Kb CMOS ECL SRAM With a Fully Pipelined Architecture", IEEE J. Solid-State Ckts., Vol. 26, No. 11, November 1991, pp. 1577-1585, incorporated herein by reference.

During power-on-reset of the circuit, and during a leakage test in reset mode, the global signal Reset is asserted ($\overline{\text{Reset}}$ goes low), forcing the evaluation node A to its reset or stand-by state. That is, when $\overline{\text{Reset}}$ goes low, the output of NAND 122 will be high, the output of inverter 123 will be low, turning on pFET QR, and pulling evaluation node A high.

On the other hand, to inhibit the pulsed logic from resetting (so that evaluation node A remains in its evaluated state given by the inputs to the nFET-tree 10), the global signal Evaluate is asserted ($\overline{\text{Evaluate}}$ goes low), thereby inhibiting a reset. That is when $\overline{\text{Evaluate}}$ goes low, the output of NAND 121 will be high. If $\overline{\text{Reset}}$ is also high, (no reset requested), the output of NAND 122 will be low, and the output of inverter 123 will be high, turning off pFET QR. Evaluation node A, therefore, will depend upon the state of the nFET tree. This feature is used for leakage tests. Similarly, it is used for burn-in, in order to provide a voltage stress on transistors in the active (evaluated) state for a duration longer than a typical pulse width.

Circuits as in FIG. 1 require another test mode because they are sensitive to two possible failure modes (apart from the ones above): 1) false evaluation due to glitches on the input to the logic tree; and 2) insufficient pulse overlap if the logic tree implements an AND type structure. In accordance with the invention, a static evaluate test mode is defined in which correct evaluation is assured despite the occurrence of glitches or mistiming.

Figure 2B:
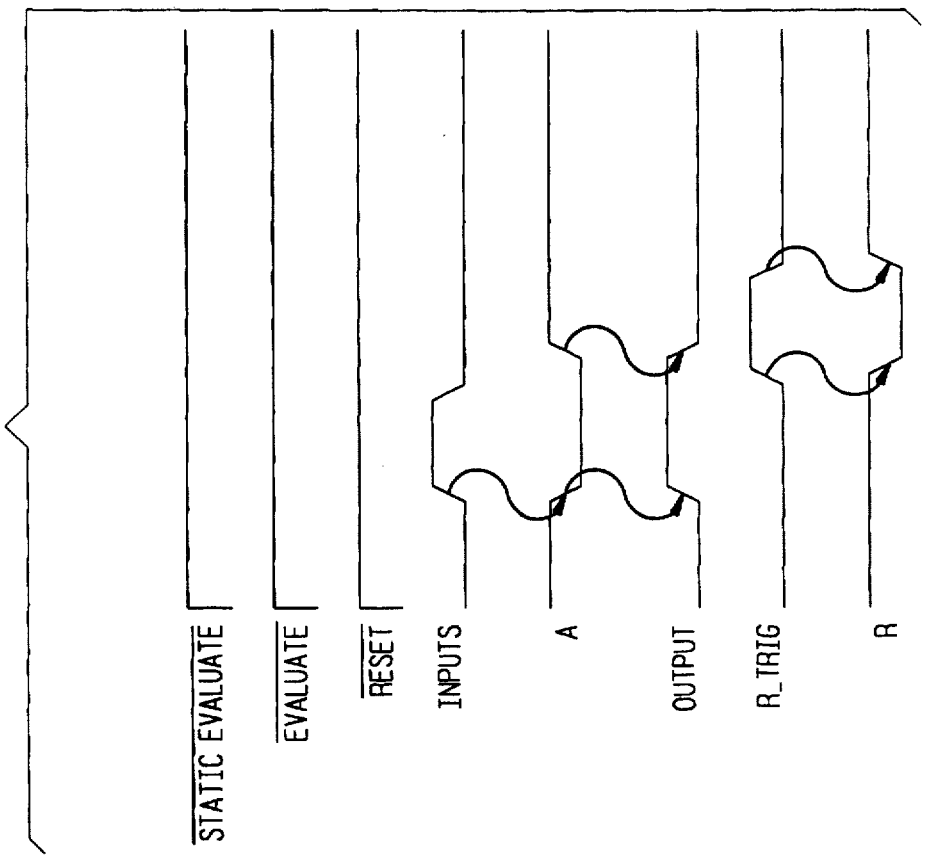
FIG. 2b is a timing diagram of the static evaluate mode of operation of the circuit of FIG. 1.

In static evaluate test mode, besides Evaluate, another global signal, Static_Evaluate, is also active. The locally inverted and buffered form, $\overline{\text{Static\_Evaluate}}$, is applied to the gate of a small leakage transistor QD. When this QD is ON ($\overline{\text{Static\_Evaluate}}$ is low), it converts the circuit of FIG. 1 effectively into a pseudo-nmos circuit. It gives evaluation node A the ability to recover from false pulldown events in the n-tree, caused by glitches or noise, as indicated in FIG. 2b. Specifically, when QD is conducting, evaluation node A will be pulled down in response to an input applied to the nFET tree 10. However, evaluation node A will return to a high condition when the input is off. Since pulses are not reset in static evaluate test mode, the input signals and output signals behave as static signals. This eliminates problems with insufficient pulse coalescence in mistimed chips, so that at least in the Static-Evaluate mode of operation, the circuits will correctly evaluate.

However, with the QD transistor enabled by Static_Evaluate, the chip dissipates static power for every circuit where the tree node is pulled down, because current will flow from $\overline{\text{Static\_Evaluate}}$ through the nFET tree to ground. This is a source of self-heating of the chip, which may not be acceptable, for example, under burn-in conditions. Therefore, Static_Evaluate is made an asymmetrically pulsed signal, with the off-time (indicated as the cool down phase in FIG. 2b) sufficiently long for cool-down. The on-time (indicated as the Evaluate phase of FIG. 2b) of Static_Evaluate is then the time in which evaluation node A exhibits glitch and noise recovery. This period should be chosen long enough to allow signals and noise to settle. At the falling edge of Static_Evaluate (rising edge of $\overline{\text{Static\_Evaluate}}$) then, all circuits should have evaluated to their final state, and the results can be latched into registers downstream from output OUT.

Registers that comply with this test mode are described in copending application Ser. No. 08/583,297 (attorney docket YO995-056), entitled "High Performance Registers for Pulsed Logic", by M. Ciraula, et al. filed concurrently herewith and incorporated herein by reference.

While the invention has been described in particular with respect to preferred embodiments thereof, it will be understood by those skilled in the art the modifications to the disclosed embodiments can be effected without departing from the spirit and scope of the invention.

We claim:

1. A dynamic circuit, comprising:
   a logic tree having one or more data inputs and an evaluation node;
   a reset circuit connected to the evaluation node and responsive to a reset signal;
   a reset inhibiting circuit coupled to the reset circuit, and responsive to a reset inhibiting signal;
   a static evaluate circuit coupled to the evaluation node of the logic tree, and responsive to a mode select signal.

2. The dynamic circuit of claim 1, wherein the logic tree comprises means for performing a logical operation on one or more input signals applied to the data inputs and for producing a corresponding signal on the evaluation node.

3. The dynamic circuit of claim 1, wherein the reset circuit comprises a switch coupled between a voltage source and the evaluation node, and means responsive to the reset signal for operating the switch to set the evaluation node to a desired state.

4. The dynamic circuit of claim 3, wherein the reset inhibiting circuit comprises means for preventing the switch from operating and therefore from restoring the evaluation node to the desired state.

5. The dynamic circuit of claim 3, wherein the desired state is a standby state.

6. The dynamic circuit of claim 1, wherein the static evaluate circuit comprises a switch coupled between a voltage source and the evaluation node, the switch being actuable in response to the mode select signal to place the evaluation node in a first logical state when the logic tree receives a first combination of input signals, and returning the evaluation node to a second state when the logic tree receives a second combination of input signals, thereby allowing the evaluation node to follow the state of the logic tree.

7. The dynamic circuit of claim 6, wherein the mode select signal is a static evaluation signal.

8. A dynamic circuit, comprising:
   a logic tree having one or more data inputs and an evaluation node, comprising means for performing a logical operation on one or more input signals applied to the data inputs and for providing a corresponding signal on the evaluation node;
   a reset circuit connected to the evaluation node, and responsive to a reset signal, comprising a reset switch coupled between a voltage source and the evaluation node, and means responsive to the reset signal for operating the switch to set the evaluation node to a desired state;
   a reset inhibiting circuit coupled to the reset circuit comprising means for preventing the reset switch from operating and restoring the evaluation node path to the desired state;

a static evaluate circuit coupled to the data output path and responsive to a static evaluate signal, comprising a second switch coupled between a voltage source and the evaluation node, the switch being actuable in response to the mode select signal to place the evaluation node in a first logical state when the logic tree receives a first combination of input signals, and returning the data output to a second state when the logic tree receives a second combination of input signals.

9. A dynamic logic circuit, comprising:

a logic tree having one or more inputs and means for performing a logical operation on the inputs to produce a logical output at the output of the logic tree;

a leakage transistor switch coupled between a voltage supply and the output of the logic tree, the leakage transistor switch being actuable by a mode select signal;

a reset transistor switch coupled between the voltage source and the logic tree output, the reset transistor switch being actuable by an actuating signal produced by a reset logic circuit in response to a predetermined combination of inputs.

10. The dynamic circuit of claim 9, wherein the inputs to the reset logic circuit comprise:

a reset signal, an evaluate signal and a reset triggering signal, and means for producing one of three operational modes in response to predetermined combinations of the reset signal and the evaluate signal.

11. The dynamic circuit of claim 10, wherein the three modes of operation include:

a functional mode, wherein the actuating signal follows the reset triggering signal;

an evaluate mode in which the reset transistor switch is open;

a reset mode in which the reset transistor switch is closed.

12. A test methodology for testing a dynamic circuit comprising a logic tree with one or more inputs and an output, and means for producing a circuit output and resetting the output to a standby state, comprising:

performing a circuit leakage test with the circuit held in a reset state;

performing a leakage test with the circuit held in an evaluated state;

performing a static evaluate test in which the circuit acts as a static circuit.

13. The methodology of claim 12, wherein the leakage test with the circuit held in a reset state comprises resetting the output of the logic tree to a predetermined state and measuring current leakage.

14. The methodology of claim 12, wherein the leakage test with the circuit held in an evaluated state comprises placing the circuit in an evaluated condition for an extended period and monitoring current leakage.

15. The methodology of claim 12, wherein the step of performing a static evaluate test comprises the steps of:

placing the circuit in a reset inhibited state, wherein the reset of the circuit is inhibited;

in a first period, coupling the evaluation node to a standby potential through a resistive device, thereby allowing the evaluation node to follow the state of the logic tree;

in a second period, switching off the resistive device so that the evaluation node holds its last value, and measuring the accuracy of the logic evaluation, independent of timing hazards and glitches.

* * * * *